United States Patent [19]

Wong

[11] Patent Number: 5,124,573
[45] Date of Patent: Jun. 23, 1992

[54] ADJUSTABLE CLOCK CHOPPER/EXPANDER CIRCUIT

[75] Inventor: Robert C. Wong, Poughkeepsie, N.Y.

[73] Assignee: International Business Machines, Armonk, N.Y.

[21] Appl. No.: 630,669

[22] Filed: Dec. 20, 1990

[51] Int. Cl.⁵ .................... H03K 3/29; H03K 3/017
[52] U.S. Cl. ............................ 307/289; 307/291; 307/265; 307/267; 307/605; 328/58
[58] Field of Search ............ 307/291, 289, 265, 267, 307/605; 328/58

[56] References Cited

U.S. PATENT DOCUMENTS

| | | | |
|---|---|---|---|
| 4,604,582 | 8/1986 | Strenkowski | 307/269 |
| 4,726,045 | 2/1988 | Caspell et al. | 328/58 |
| 4,851,711 | 7/1989 | Chan | 307/288 |
| 4,970,418 | 11/1990 | Masterson | 328/58 |

OTHER PUBLICATIONS

IBM Technical Disclosure Bulletin, vol. 30, No. 6, Nov. 1987, entitled "Clock Expander with Mutually Referenced Current Switches" by R. C. Wong.
IBM Technical Disclosure Bulletin, vol. 29, No. 7, Dec. 1986, entitled "Clock Chopper for Complementary--Transistor Switch Arrays", by Y. H. Chan.
IBM Technical Disclosure Bulletin, vol. 31, No. 4, Sep. 1988, entitled "Mutually-Referenced Current Switches", by R. C. Wong.

Primary Examiner—Stanley D. Miller
Assistant Examiner—Margaret Rose Wambach
Attorney, Agent, or Firm—Richard A. Romanchik

[57] ABSTRACT

A clock chopper/expander circuit 10 includes a reset dominant latch circuit 20 which is set by a CLOCK IN signal 12 and reset by a delayed CLOCK IN signal labelled DELAY 26, provided by an asymmetrical delay circuit 22 which delays the CLOCK IN signal $T_D$ seconds. The delay circuit 22 utilizes an adjustable bias current source 64 to bias a half memory cell 50, which charges up a node 62 according to the write time of the cell 50. A sensing circuit triggers a DELAY transition when node 62 crosses a voltage predetermined by the bias provided to a second half memory cell 52 which is also controlled by the bias current source 64. A multiplexer 24 provides disablement of the clock chopping/expanding function and an OR gate 14 facilitates easy measurement of the actual delay introduced by circuit 22.

24 Claims, 4 Drawing Sheets

ADJUSTABLE CLOCK CHOPPER/EXPANDER CIRCUIT

TECHNICAL FIELD

The present invention relates to digital timing circuits and more particularly an adjustable, asymmetrical clock chopper/expander circuit.

BACKGROUND ART

In digital logic systems utilizing a large number of boards or cards for mounting a plurality of integrated circuits, master clock signals are frequently generated by a common clock generator circuit. The clock pulses produced thereby are distributed throughout the logic system. These clock pulses provide timing signals at a particular time within the repetitive clock cycle provided by a master system clock. The clock pulses, however, may not be suitable for the purpose of controlling the operation of all the circuits on a given chip. Hence, a clock chopper may be required on the chip to produce from the system clock pulses input thereto a suitable set of on-chip clock pulses.

Clock chopper circuits are quite widely used in various applications. Generally, the circuits produce a pulse which has a shorter duration than the system clock pulses input thereto. Examples of such clock choppers are found in the IBM Technical Disclosure Bulletin Volume 29, No. 7, December 1986, pages 3148–3151 (Chan) and commonly owned U.S. Pat. No. 4,851,711 (Chan et al.).

Chan discloses a clock chopper circuit designed around complementary transistor switch (CTS) random access memories that offers relatively low complexity and minimal chip access penalty. In Chan, a master clock input is provided to a timing enable receiver which provides complementary inputs to a delay generator configured from a CTS memory cell. The time required to write the cell determines the width of the generated delayed pulse. The output of the delay generator is thereafter coupled by a level converter circuit to a gate receiver (OR) circuit, which ORs the master clock input signal with the delayed pulse to thereby produce the shortened output clock pulses. A drawback to the clock chopper disclosed in Chan is that the cycle time of the circuit is limited to being greater than the combined turn on (select) and turn off (restore or settling) time for the CTS memory cell, the turn on and turn off times being approximately equal. Accordingly, circuits of the type described in Chan are limited to applications where the cycle time is at least as long as the set and reset time of a CTS memory cell.

Chan et al. discloses an improvement to the clock chopper circuit of Chan utilizing an asymmetrical delay generator circuit. The Chan et al. delay generator circuit is based on a CTS memory cell which operates differently than the one described in Chan. In Chan et al., one half of the cell operates in saturation and controls the pulse width of the chopper while the other half of the CTS cell is not operated in saturation and controls the resetting of the chopper circuit. The delay pulse thereby generated is asymmetrical because the write time of the cell is longer than the read, or reset, time. The clock chopper circuit disclosed in Chan et al. can therefore chop higher input clock rates than that of Chan.

Chan and Chan et al. both disclose clock chopper circuits wherein a delay generator circuit is the primary contributor for determining the output pulse width and hence, the clock chopping function. The delay generator circuits in both references utilize the write and reset time of a CTS memory cell for establishing the actual delay. The cycle time for each circuit is limited to being greater than the turn on and turn off time for each cell. CTS type memory cells, however, have relatively slow restore or settling times when compared with current technology. Clock chopper circuits are required which operate faster than these devices.

Another drawback to the clock chopper disclosed in Chan et al. concerns the integration of Schottky Barrier Diodes SL, SS, and SR into the circuit, because the operating characteristics of these devices are difficult to control. The delay represented by these diodes alone is sometimes longer than the maximum delay allowable.

Chan and Chan et al. represent typical clock chopper circuits known in the prior art. A device which overcomes the aforementioned drawbacks of these circuits is therefore highly desirable.

DISCLOSURE OF THE INVENTION

The object of the present invention is to provide for an improved clock chopper circuit which both chops and expands master clock input signals.

Another object of the present invention is to provide for an improved clock chopper circuit which converts a clock input signal with a varying pulse width into a clock output signal having a consistent pulse width.

Another object of the present invention is to provide for an improved clock chopper circuit which relies only upon the write time of a Harper pnp load half memory cell for functionality and can therefore operate at higher clock input frequencies.

Another object of the present invention is to provide for a clock chopper circuit wherein the output clock pulse width is externally adjustable.

Yet another object of the present invention is to provide for an improved clock chopper circuit which facilitates external measurement of the actual delay generator time.

According to the present invention, a clock chopper/expander circuit includes an input clock pulse provided to the "set" input of a reset dominant latch and also to an asymmetrical delay generator circuit which provides a delayed clock input signal to the "reset" input of the reset dominant latch. The output of the latch circuit will either reduce or expand the input clock signal depending on the amount of delay introduced by the delay generator circuit, the delay being dependent upon the write time of a half memory cell. A current bias circuit provides for external adjustment of the write time of the half memory cell. An optional multiplexer circuit provides an enable/disable function to the chopper circuit and an optional OR gate facilitates external measurement of the actual delay introduced by the delay generator circuit.

The present invention provides for both chopping and expanding functions without having to change internal circuitry. The present invention provides a consistent pulse width output even though the clock input signal pulse width may have a large variation. A one stage reset dominant latch minimizes time delay between the leading edge of the chopper circuit output signal and the leading edge of the clock input signal. Also, an improved asymmetrical delay circuit allows for higher frequency input clock signals than previously attainable. The present invention also facilitates testing of the actual delay introduced by the delay circuit in the frequency domain, thereby providing highly accurate measurements. Furthermore, the present invention automatically resets itself to zero if the clock output signal is powered up at logic high.

These and other objects, features and advantages of the present invention will become more apparent in light of the detailed description of exemplary embodiments thereof, as illustrated by the drawings.

BEST MODE FOR CARRYING OUT THE INVENTION

Figure 1:
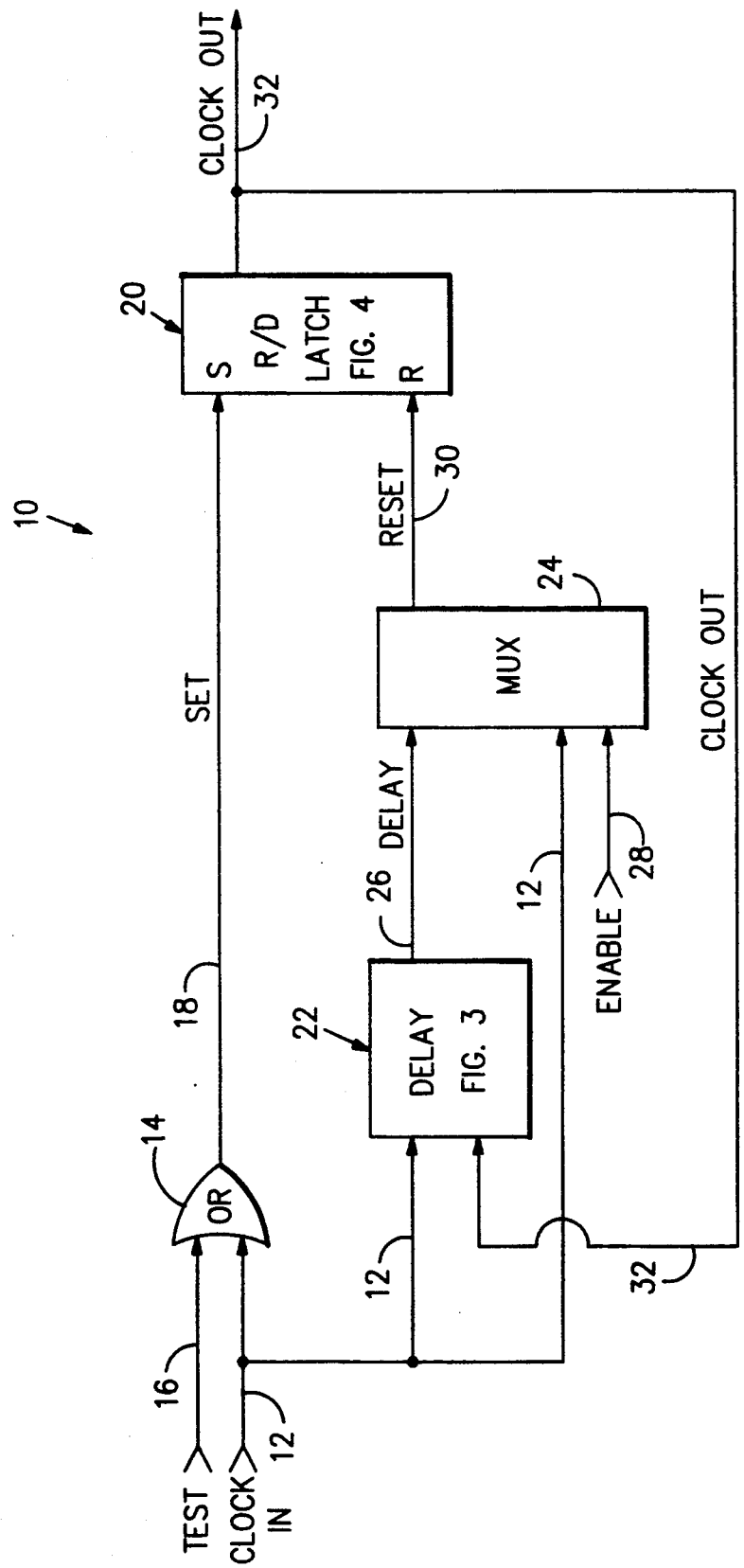
FIG. 1 is a schematic block diagram of the chopper circuit of the present invention.

Referring now to FIG. 1, the clock chopper/expander circuit 10 of the present invention includes a master CLOCK IN signal on a line 12 and a TEST signal on a line 16 provided to an OR gate circuit 14. The output of OR gate 14 is provided on a line 18 to the SET input of a reset dominant (R/D) latch circuit 20.

The CLOCK IN signal on line 12 is also provided as an input to a delay circuit 22 and a multiplexer circuit 24. The DELAY signal output of delay circuit 22 is provided on a line 26 as a second input to multiplexer circuit 24 and the ENABLE signal on a line 28 is provided as the control input to the multiplexer 24.

The output signal of multiplexer 24 is labelled RESET and is provided on a line 30 to the reset input of latch circuit 20. The CLOCK OUT output signal of latch circuit 20 is the clock chopper/expander circuit 10 output signal and is provided on a line 32. CLOCK OUT is also fed back as an input to delay circuit 22.

All of the signals on lines 12, 16, 18, 26, 30, and 32 are digital logic signals representing either a logic 1 (high) or logic 0 (low).

The circuit of FIG. 1 operates in the following manner. During normal operation of clock chopper/expander circuit 10 TEST on line 16 and ENABLE on line 28 are held low. CLOCK IN is therefore passed through OR gate 14 and provided to the SET input of latch circuit 20. The truth table for latch circuit 20 is as follows:

| S | R | CLOCK OUT |
|---|---|-----------|
| 0 | 0 | CLOCK OUT |
| 1 | 0 | 1 |
| 0 | 1 | 0 |
| 1 | 1 | 0 |

It is the fourth state (both inputs are 1 and the output is 0) which distinguishes latch circuit 20 as a reset dominant latch circuit. A set dominate latch would provide a high output when both the set and reset inputs are high.

Assuming an initial state in which all signals are low, a low to high CLOCK IN transition sets latch circuit 20 thereby providing a low to high CLOCK OUT transition. CLOCK OUT will thereafter remain high until the latch circuit 20 is provided with a low to high transition on the RESET line 30.

The initial low to high transition of the CLOCK IN signal is also provided to the delay circuit 22 which delays CLOCK IN transitions by a predetermined amount of time $T_D$. The delay circuit 22 also inverts CLOCK IN so that DELAY is a complement of a delayed CLOCK IN.

Multiplexer 24 operates in the following manner. ENABLE is the control signal for multiplexer 24 and DELAY and CLOCK IN are the data inputs. When ENABLE is low, multiplexer 24 inverts the DELAY signal and provides it on the RESET line 30. Since DELAY is a delayed and inverted CLOCK IN signal, the output of multiplexer 24 is a delayed, true (not complement) CLOCK IN signal when ENABLE is low. When ENABLE is high, multiplexer 24 inverts the CLOCK IN signal and provides it on the RESET line 30.

In the present example, ENABLE is low and multiplexer 24 passes the DELAY signal to the RESET signal line 30. A low to high RESET transition therefore occurs approximately $T_D$ seconds (assuming little or no delay by multiplexer 24) after the low to high transition on SET line 12. Latch 20 will accordingly be set, then reset, thereby providing a clock pulse on the CLOCK OUT line 32 with a width of $T_D$ seconds. This clock pulse is thereafter provided to dependent external circuitry, which is not shown.

In addition to providing a multiplexing function, the multiplexer circuit 24 also provides a voltage level shift to the CLOCK IN or DELAY signals to cause the RESET signal voltage swing to be approximately 0.3 volts higher than the SET signal voltage swing. For instance, the preferred SET signal voltage swing is from approximately −0.5 volts to +0.1 volts. The multiplexer circuit 24 therefore provides a RESET signal voltage swing from approximately −0.2 volts to +0.4 volts. This level shifting function is necessary for the reset dominant function of the preferred latch circuit 20, as will be explained in greater detail hereinafter in the description of FIG. 4. Of course, other reset dominant latches (not shown) may be utilized which do not depend on level shifted RESET signals.

The CLOCK OUT signal on line 32 is also fed back to the delay circuit 22 on a line 32 (as will be discussed in further detail hereinafter in the description for FIG. 3), for the following two purposes: 1) for ensuring DELAY high to low transition for very narrow CLOCK IN pulses; and 2) for resetting the latch 20 in FIG. 1 to zero if CLOCK OUT is logic high upon power up.

The ENABLE signal on line 28 and the multiplexer circuit 24 control the clock chopper/expander circuit 10 in the following manner. When ENABLE is low, multiplexer 24 provides an inverted DELAY signal to the reset input of R/D latch 20, thereby rendering CLOCK OUT as a clock signal with a pulse width dependent on the delay time $T_D$ as previously discussed. If ENABLE is held high, multiplexer 24 provides an inverted CLOCK IN to the reset input of R/D latch 20. Each low to high SET transition will be coupled with a high to low RESET transition and vice versa. The CLOCK OUT output of R/D latch 20 will therefore effectively be CLOCK IN signal. ENABLE, therefore, controls whether circuit 10 provides either CLOCK IN or a chopped/expanded CLOCK IN on line 32.

OR gate circuit 14 facilitates the external testing of the amount of delay introduced by delay circuit 22. If CLOCK IN is held low and TEST is held high, OR gate circuit 14 will provide a continuous logic high output which sets latch 20 and drives CLOCK OUT high. The logic high CLOCK OUT signal is fed back on line 32, delayed and inverted by circuit 22 and inverted by multiplexer 24. The true, delay signal is thereafter provided to reset latch 20 to zero. CLOCK OUT will then transition to zero and remain there until the zero level passes through delay circuit 22 and multiplexer 24. The result is a CLOCK OUT signal having a pulse width of $T_D$ seconds. The delay introduced by circuits 20, 22, and 24, therefore, can be determined easily by measuring the CLOCK OUT pulse width in either real time or in the frequency domain.

It is to be noted that the clock chopper/expander circuit may be simplified by elimination of either the OR gate 14 or the multiplexer 24 or both. In such a case, the CLOCK IN signal would be connected to the set input of latch 20 and the DELAY signal would be connected to the reset input.

Figure 2A:
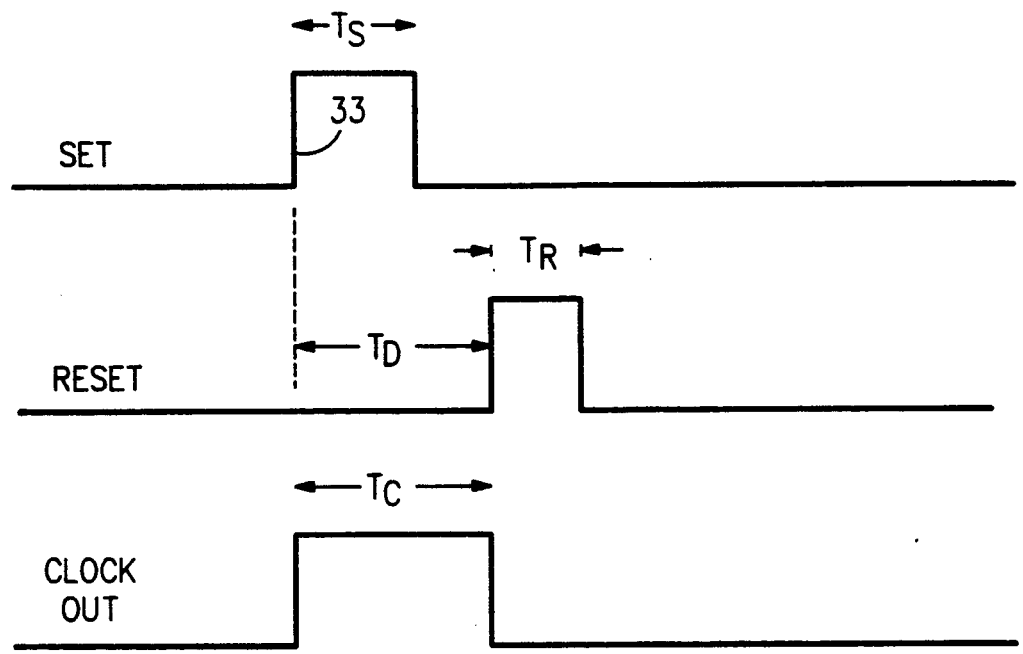
FIG. 2A is a timing diagram of the expansion function of the clock chopper circuit of the present invention.

Referring now to FIG. 2A, a timing diagram of the clock chopper/expander circuit 10 utilized in the expand mode includes a low to high SET signal transition 33 provided by the OR gate 14 which sets latch circuit 20 to thereby provide a low to high CLOCK OUT transition on line 32. Once the latch circuit 20 is set, CLOCK OUT remains high until the latch circuit 20 is reset by a low to high RESET signal transition 34 provided by the delay circuit 26 after a delay of $T_D$ seconds. CLOCK OUT will then remain low until the next low to high transition of the SET signal sets the latch circuit 20. The CLOCK OUT pulse has a pulse width of $T_C$ seconds. The clock chopper/expander circuit is in an expand mode when the delay $T_D$ is longer than the CLOCK IN signal pulse width $T_S$. It is to be noted that the reset dominant latch circuit 20 cannot be set again until RESET transitions from a logic high to a logic low. As will be described hereinafter, the periodicity of the CLOCK OUT signal can therefore be increased by making the RESET pulse width $T_R$ shorter than the SET pulse width $T_S$.

Figure 2B:
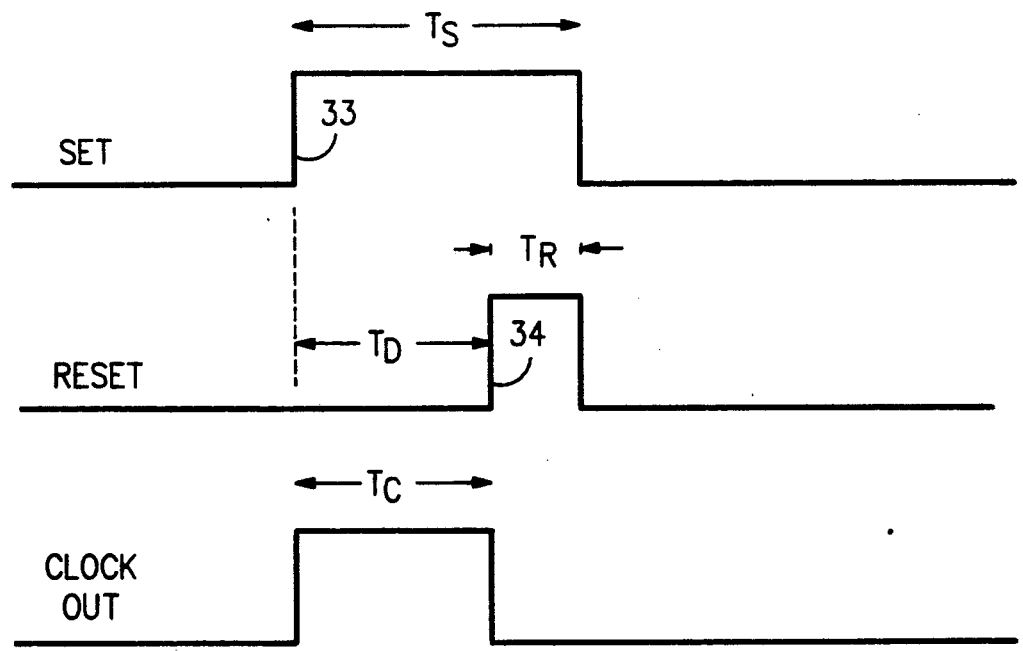
FIG. 2B is a timing diagram of the chopping function of the clock chopper circuit of the present invention.

Referring now to FIG. 2B, a timing diagram of the clock chopper/expander circuit 10 utilized in the chop mode includes a low to high SET signal transition 33 provided by the OR gate 14 which sets latch circuit 20 to thereby provide a low to high CLOCK OUT transition on line 32. Once the latch circuit 20 is set, CLOCK OUT remains high until the latch circuit 20 is reset by a low to high RESET signal transition provided by delay circuit 26 after a delay of $T_D$ seconds. CLOCK OUT will then remain low until the next low to high transition of the SET signal sets the latch circuit 20. CLOCK OUT again has a pulse width of $T_C$ seconds. The clock chopper/expander circuit is in a chop mode when the delay $T_D$ is shorter than the CLOCK IN signal pulse width $T_S$.

It is to be noted that the dual chopping/expanding function of the present invention provides for CLOCK OUT signal with a stable pulse width $T_D$ even though the clock input signal may have a varying pulse width. As shown in FIGS. 2A and 2B, the CLOCK OUT pulse width $T_C$ remains the same even though the SET pulse width $T_S$ has changed.

Figure 3:
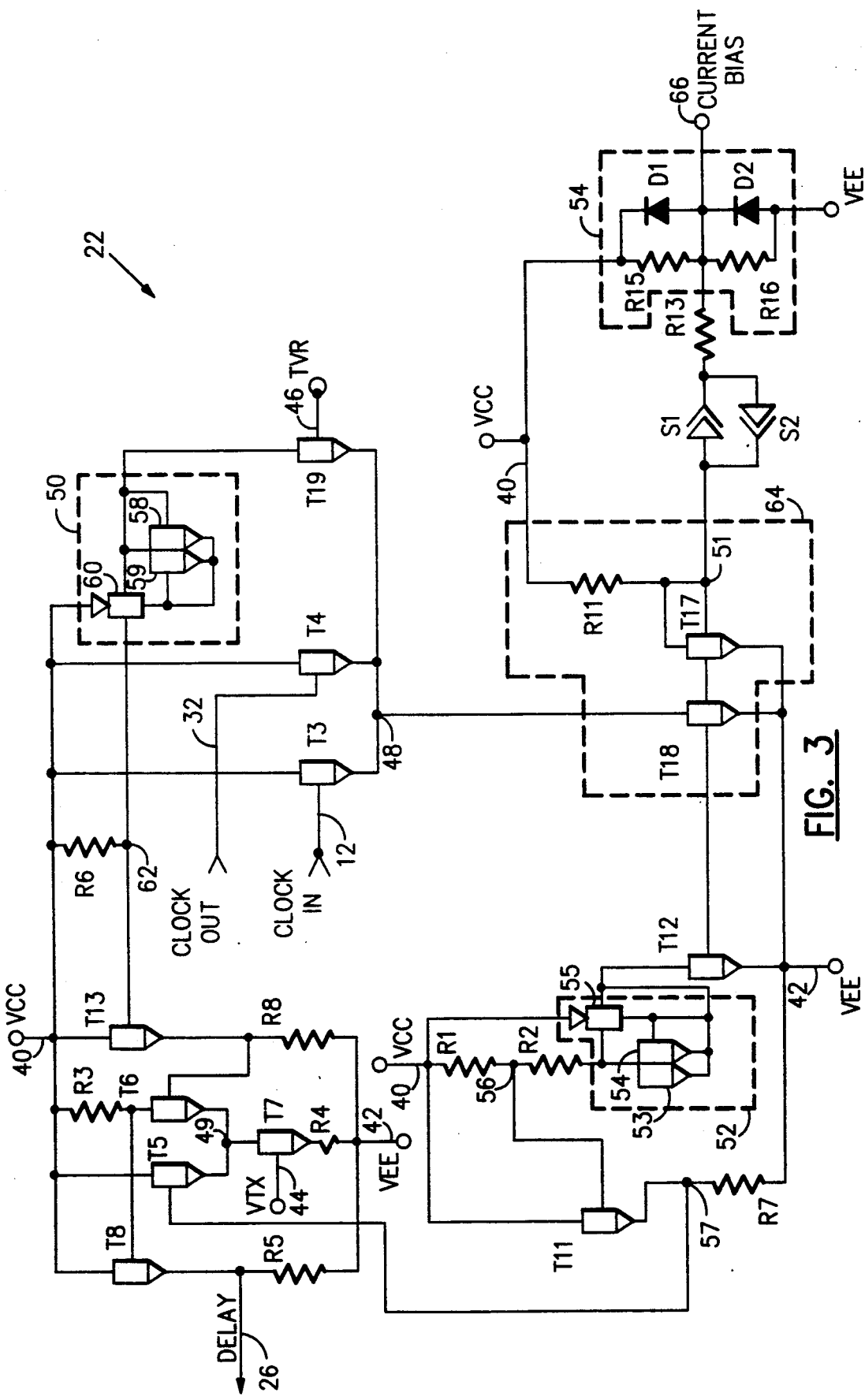
FIG. 3 is a schematic diagram of the delay circuit of the present invention.

Referring now to FIG. 3, the DELAY signal on line 26 is provided by the emitter of a pull-up transistor T8 which is connected between a voltage supply VCC and a resistor R5. R5 is connected between T8 and a second voltage supply VEE. The control gate of transistor T8 is connected to the collector of a transistor T6 which is connected between resistor R3 and common node 49. A transistor T5 is connected between VCC and node 49. A transistor T7 is connected between node 49 and resistor R4 which is in turn connected to VEE. The control gate of transistor T7 is biased by a reference voltage VTX. Transistors T5, T6 and T7 are connected in a current switch configuration, with the current through T7 being shared by T5 and T6. The control gate of transistor T6 is connected to the emitter of a transistor T13 which is connected between VCC and a resistor R8 which is, in turn, connected to VEE. The control gate of transistor T13 is connected to a node 62 of a cell 50. A resistor R6 is connected between common node 62 and VCC. Cell 50 is one half of a memory cell known in the art as a Harper pnp load cell and is comprised of a pair of npn transistors 58, 59 which have their control gates connected together to the base and emitter of a pnp transistor 60. Cell 50 is considered a one half memory cell because a Harper pnp load cell is comprised of two pairs of npn transistors, both pairs having their control gates connected to the base and emitter of two individual pnp transistors. The collectors of the npn transistors 58,59 are connected to the base of transistor 60 and the emitters of transistors 58, 59 are connected to the emitter of transistor 60. The collector of transistor 60 is connected to VCC and the base of transistor 60 is connected also to a node 62. Cell 50 is therefore effectively biased between VCC and the collector of a transistor T19 which is connected between cell 50 and a common node 48. The control gate of transistor T19 is connected to a reference voltage VTR. The CLOCK IN signal provided on line 12 is connected to the control gate of a transistor T3 which is connected between VCC and node 48. The CLOCK OUT signal provided on line 32 is connected to the control gate of a transistor T4 which is connected between VCC and node 48 also.

Transistors T3, T4, T19 and T18 are connected in a current switch configuration, with the current flowing through T18 being shared by T3, T4 and T19. The amount of current pulled from node 48 is therefore regulated by a transistor T18, which has its collector connected to node 48 and its emitter connected to VEE.

Transistors T17 and T18 are connected in a current mirror configuration by having their control gates connected together. Transistor T17 is connected between a common node 51 and VEE. The control gate of transistor T17 is also connected to node 51. A resistor R11 is connected between node 51 and VCC. Transistors T17 and T18 and resistor R11 make up a current source circuit 64, which controls the current being pulled by node 48.

A pair of Schottky diodes S1, S2, which are configured to float node 51 from a current bias source (which is described hereinafter), and are connected oppositely between node 51 and a resistor R13. Resistor R13 is connected between diodes Sl, S2 and an ESD protector circuit 54 which is comprised of a resistor R15 and a diode D1 connected in parallel between a common node 66 and VCC, and a resistor R16 and a diode D2 connected in parallel between node 66 and VEE. Node 66 of ESD protector circuit 54 may either be a floating node or may be connected to an external current bias source (which is not shown).

The control gate of transistor T18 is also connected to the control gate of a transistor T12 which is connected between a half memory cell 52 and VEE. Cell 52 is the same as cell 50 with npn transistors 53, 54 having their bases and emitters connected to the emitter and base of pnp transistor 55. The base of transistor 55 is also connected to: a) the collectors of transistors 53, 54; b) the collector of T12; and c) a resistor R2. Cell 52 is therefore effectively biased between VCC and a voltage at one end of a resistor R2. Resistor R2 is connected between cell 52 and a common node 56. A resistor R1 is connected between node 56 and VCC. The control gate of a transistor T11 is connected to node 56 also, and transistor T11 is connected between VCC and a common node 57. A resistor R7 is connected between node 57 and VEE. The control gate of transistor T5 is connected to node 57 also.

The delay circuit of FIG. 3 operates in the following manner. The amount of current flowing through T18 is shared by T3, T4, and T19, because they are connected with transistor T18 in a current switch configuration. Assuming an initial state wherein CLOCK IN and CLOCK OUT are logic low, a CLOCK IN low to high transition will therefore turn transistor T3 on, and transistor T19 off. When T19 stops conducting, the diffusion capacitance of the emitter base junction of PNP transistor 60 in cell 50 will charge the voltage at node 62 up exponentially according to the RC time constant existing between R6 and the diffusion capacitance of the P-N junction of transistor 60, which is dependent on the current being pulled by transistor T19 prior to the initial CLOCK IN low to high transition.

As the voltage at node 62 increases, the current through T13 increases, thereby causing the voltage at the base of T6 to increase. Transistors T5, T6 and T7 are connected in a current switch configuration. Therefore, when the voltage at the base of T6 exceeds the voltage at the base of T5, T6 will turn on. The voltage at the collector of T6 will consequently go down and the emitter voltage level T8 will drop, thereby causing the DELAY signal on line 26 to transition from logic high to logic low. The turn on voltage of T6 consequently determines the delay time $T_D$ illustrated in FIGS. 2A and 2B. It can be seen that the current switch comprising T5, T6 and T7 acts as a voltage comparator, comparing the emitter voltage of T13 with the base voltage of T5. When the emitter voltage of T13 exceeds the base voltage of T5, the DELAY signal changes state. The voltage pick off point of the charge voltage at node 62 can be adjusted by either changing VTX or the voltage at the base of T5, and changing the pick off point changes the delay time TD.

When CLOCK IN transitions from high to low, and CLOCK OUT is low, transistor T3 turns off and transistor T19 turns on (in order to maintain constant current through T18). When T19 turns on, the voltage at node 62 is discharged. T13 is consequently turned off, T6 is turned off, the emitter voltage of T8 goes up and DELAY transitions from logic low to logic high.

A low to high CLOCK IN transition therefore causes a delayed high to low transition of DELAY, with the delay time being dependent upon the RC time constant of cell 50 in conjunction with resistor R6 and the initial current pulled by T19, which is in turn dependent upon the current through T18. The current pulled by T18 is, in turn, dependent upon the current through T17 and the current provided at node 66 by the external current bias source, which is not shown.

A high to low transition of the input of CLOCK IN causes a delayed low to high DELAY transition which is dependent upon the turn on time of T19 and cell transistor 60 and the current drawn by transistor T18. The DELAY low to high transition therefore occurs much closer in time to the CLOCK IN high to low than the delay between a CLOCK IN low to high and the resultant DELAY high to low. In other words, the DELAY pulse is asymmetrical with respect to the CLOCK IN pulse (i.e. the pulse width $T_R$ of RESET as shown in FIGS. 2A and 2B is smaller than the pulse width $T_S$ of SET). This shortened RESET pulse width allows for utilization of higher frequency CLOCK IN signals and narrower CLOCK IN pulse widths.

The delay between the rising CLOCK IN edge and the falling DELAY edge (i.e. the delay time $T_D$ in FIGS. 2A and 2B) is dependent upon a number of factors, one of which is the current being pulled by T19 when CLOCK IN is low. That current is in turn indirectly dependent upon the bias provided by both the current source 64 and the amount of current provided at node 66 by the external current source, which is not shown. The delay time, and hence: a) whether the circuit 10 is in either the chopping or expanding mode; and b) the amount of chopping or expanding performed is therefore externally adjustable by varying the current supplied at node. The more current supplied, the longer the delay time $T_D$.

Current source circuit 64 is isolated from the external current bias source by Schottky diodes S1 and S2. These two diodes filter out any signal which is lower than their forward conduction voltage. Resistors R15 and R16 and diodes D1, D2 comprise an ESD protection circuit to protect the delay circuit 22 from electrostatic discharge, and a noise suppression circuit.

The delay time $T_D$ introduced by circuit 22 is also dependent upon the voltage level at which transistor T6 turns on. This level, in turn, is dependent upon (among other factors such as component values): a) the voltage provided to the base of transistor T5 (since transistors T5 and T6 are connected in a current switch configuration); and b) the reference voltage VTX connected to the base of T7. The voltage at the control gate of T5 is provided by node 57, which is the connection point between the emitter of transistor T11 and resistor R7. The control gate of T11 is connected to node 56 between resistors R1 and R2. The voltage at node 56 is dependent upon the voltage between R1 and R2, which is in turn dependent upon the charge voltage of memory cell 52. The voltage provided by cell 52 is, in turn, controlled by the current pulled by transistor T12 which is connected in a current mirror configuration with transistors T18 and T17. The operating point of T5 and T6 is therefore indirectly dependent upon the current provided at node 66 by the aforementioned external current source.

It is to be noted that the current switch comprised of transistors T5, T6 and T7 acts as a comparator circuit, comparing the turn on voltage of T6 with the voltage at the emitter of T13. The DELAY signal on line 26 changes state each time the voltage at the emitter of T13 crosses the turn on voltage of T6. In the preferred embodiment, the turn on voltage of T6 is half way between the voltage swing at the emitter of T13.

The purpose for making the operating point of T6 dependent upon cell 52 is to ensure that the turn on point of T6 (i.e. the charge voltage at which a DELAY transition occurs) does not drift relative to the charge time of cell 50. In other words, environmental changes will have a similar effect upon both the charge time of cell 50 and the voltage trigger point at which the DELAY transition occurs. The delay time $T_D$ therefore remains relatively constant under changing environmental conditions.

CLOCK OUT on line 32 is fed back from the output and provided to the base of T4 for the following two purposes: 1) for ensuring DELAY high to low transition for very narrow CLOCK IN pulses; and 2) for resetting the latch 20 in FIG. 1 to zero if CLOCK OUT is logic high upon power up. These objectives are accomplished because T4 is turned on when CLOCK OUT transitions from low to high (i.e. latch 20 is set). T19 will therefore remain off at least until a DELAY transition propagates through the multiplexer of FIG. 1 and resets latch 20. As long as T19 remains off, node 62 will remain charged and the DELAY signal will stay low. Without T4 and the CLOCK OUT feed back, very narrow CLOCK IN pulses will not keep T19 turned off long enough to charge node 62 up to sufficient voltage to turn T13 on and the DELAY signal will not transition in response to the narrow CLOCK IN pulse. If CLOCK OUT is high upon power up, T4 will turn on, T19 will turn off, node 62 will be charged up, DELAY will transition and latch 20 will be reset, thereby forcing CLOCK OUT low. This sequence ensures CLOCK OUT will not stay high for long time periods.

Figure 4:
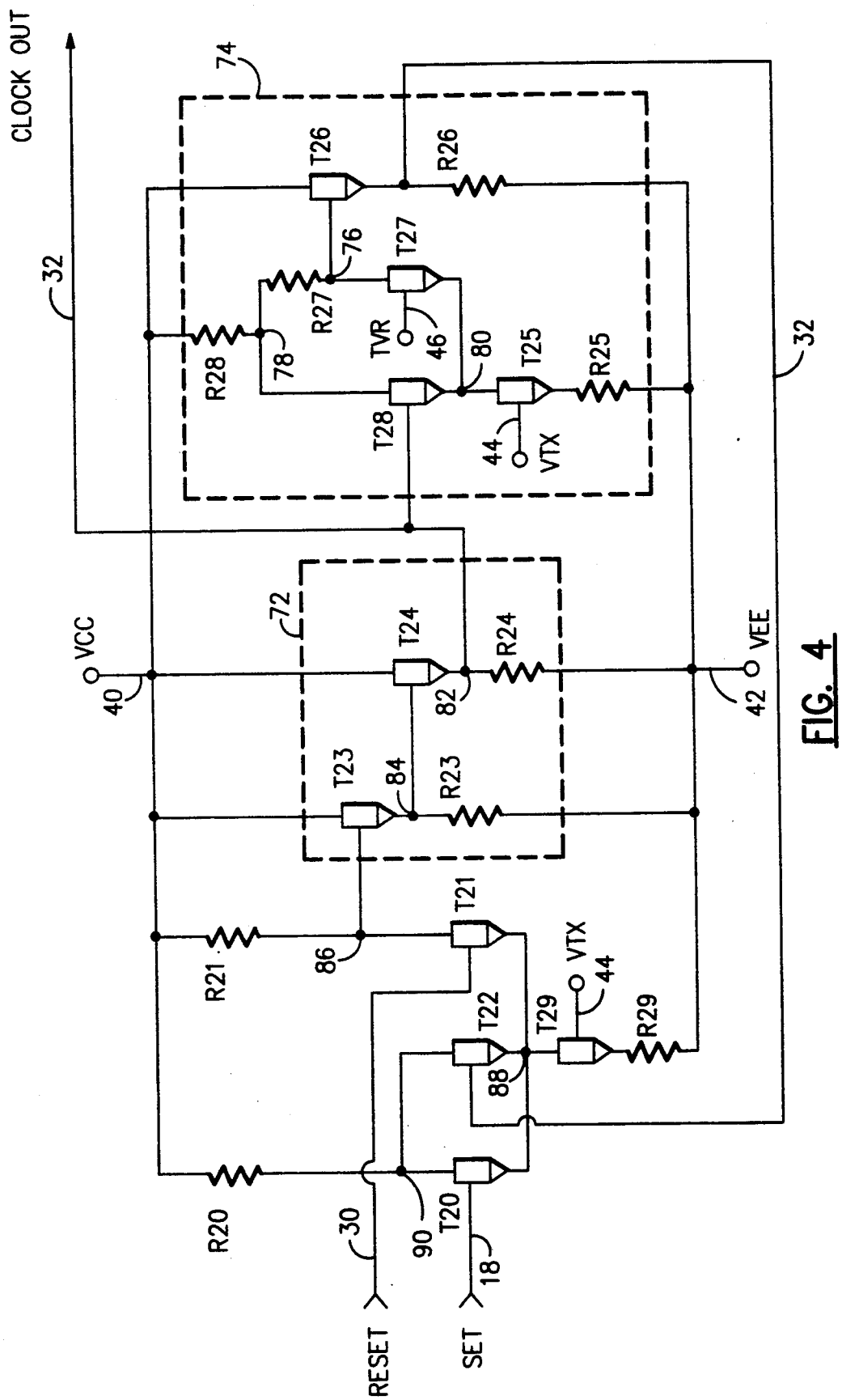
FIG. 4 is a schematic diagram of the reset dominant latch circuit of the present invention.

Referring now to FIG. 4, the reset dominant latch circuit 20 is provided power supplies $V_{CC}$ and VEE on lines 40, 42 and reference voltages VTX and VTR on lines 44, 46.

The CLOCK OUT signal on line 32 is provided by a driver circuit 72. Line 32 is connected to the emitter of a transistor T24, which is connected between a node 82 and VCC. A resistor R24 is connected between node 82 and VEE. The control gate of T24 is connected to a node 84. A transistor T23 is connected between node 84 and VCC and a resistor R23 is connected between node 84 and VEE. The control gate of T23 is connected to a node 86. A resistor R21 is connected between node 86 and VCC. A transistor T21 is connected between node 86 and a node 88. The control gate of T21 is connected to the RESET signal on line 30. A transistor T20 is connected between a node 90 and node 88. The control gate of T20 is connected to the SET signal on line 18. A resistor R20 is connected between VCC and node 90. Transistors T20-T22 and T29 are connected in a current switch configuration, with the current pulled through T29 being shared by T20-T22. Transistor T29 is connected between node 88 and a resistor R29 which is in turn connected to the VEE. The control gate of T29 is connected to reference voltage VTX for maintaining a constant current through T29. Transistor T22 is connected between node 90 and node 88. The control gate of T22 is connected to the emitter of a transistor 26, which is the output of a level shifter circuit 74. Transistor T26 is connected between VCC and a resistor R26. Resistor R26 is connected between T26 and VEE. The control gate of T26 is connected to a node 76. A resistor R27 is connected between node 76 and a node 78. A resistor R28 is connected between node 78 and VCC. A transistor T27 is connected between node 76 and a node 80. The control gate of T27 is connected to VTR. A transistor T25 is connected between node 80 and a resistor R25 which is in turn connected to VEE. The control gate of T25 is connected to VTX. A transistor T28 is connected between node 78 and node 80. The control gate of T28 is connected to the CLOCK OUT signal line 32. Transistors T27, T28 and T25 are connected in a current switch configuration, with the current through T25 being shared by T27 and T28.

The R/D latch circuit 20 of FIG. 4 operates in the following manner. A low to high SET transition turns T20 on, thereby turning T21 off and raising the voltage at node 86. The low to high transition at node 86 is passed through driver circuit 72. Circuit 72 thereby provides a low to high CLOCK OUT transition. This transition is passed through level shifter circuit 74 and fed back to transistor T22, thereby maintaining T21 in an off condition. Level shifter 74 shifts the voltage swing of the signal at node 82 to the voltage swing of the SET signal. CLOCK OUT will stay high until a low to high RESET transition is provided on line 30. As previously described, the voltage swing of the RESET signal is shifted approximately 0.3 volts above the swing of the SET signal. Therefore, when RESET goes high, T21 is turned on to thereby pull node 86 low and turn off the driver circuit 72, causing a CLOCK OUT high to low transition. This transition is fed back through level shifter circuit 74 to T22, keeping T21 turned on. CLOCK OUT will thereby stay low until RESET goes low and SET goes high. Thus the latch circuit 20 is considered a reset dominant latch.

IBM Technical Disclosure Bulletin Vol. 30, No. 6, November 1987 by R. C. Wong discloses a clock expander circuit which utilizes a set dominant latch similar to the reset dominant latch of the present invention and is hereby incorporated by reference.

It is to be noted that the OR gate 14 and the multiplexer circuit 24 are optional circuitry which provide only a test and disable function. The speed of the clock chopper/expander circuit may be increased without the delays represented by these two circuits 14, 24. If the multiplexer 24 is removed from the preferred embodiment as illustrated in FIGS. 1-4, two changes must be made in order for the clock chopper/expander circuit to work: a) an inverter must be inserted between the delay circuit 22 and the latch circuit 20 in order to replace the aforementioned inverter function of the multiplexer 24; and b) a level shifter must inserted between the delay circuit 22 and the latch circuit 20 in order to replace the aforementioned level shifting function of the multiplexer 24, which shifts the voltage swing of the DELAY signal approximately 0.3 volts higher than the voltage swing of the SET signal. The voltage shift of the reset signal is necessary to maintain latch circuit 20 as a reset dominant latch, as described hereinbefore. Alternatively, the output stage of the delay circuit may provide a true (not complement) delayed CLOCK IN signal, thereby absolving the necessity of an inverter, and a different reset dominant latch which does not require a level shifted RESET signal may be used.

Although the invention has been shown and described with exemplary embodiments thereof, it should be understood by those skilled in the art that the foregoing and various other changes, omissions and additions may be made therein and thereto without departing from the spirit and scope of the invention.

What is claimed is:

1. A clock chopper/expander circuit for either chopping or expanding a clock input signal comprising:

first cell means responsive to the clock input signal for charging up a first voltage of a first node for each low to high transition of the clock input signal, and discharging said first voltage for each high to low transition of the clock input signal, for providing a delayed clock signal indicative of said first voltage; and reset dominant latch means having a set input responsive to the clock input signal and a reset input responsive to said delayed clock signal, for providing a clock output signal indicative of a set or reset status of said reset dominant latch means, wherein said reset dominant latch means is set if the clock input signal is logic high and said delayed clock signal is logic low and said reset dominant latch means is reset if said delayed clock signal is logic high.

2. The clock chopper/expander circuit according to claim 1, further comprising first bias current means for providing a bias current to said first cell means, wherein a time required for said first cell means to charge up said first voltage is dependent upon said bias current.

3. The clock chopper/expander circuit according to claim 2, further comprising:

comparator means for comparing said first voltage with a predetermined reference voltage for providing said delayed clock signal, wherein said comparator means changes said delayed clock signal in direct relation to said first voltage being either greater or lesser than said predetermined reference voltage; and second cell means responsive to said bias current for charging up a second voltage at a second node in proportion to said bias current, wherein said predetermined reference voltage is indicative of said second voltage.

4. The clock chopper/expander circuit according to claim 1, further comprising comparator means for comparing said first voltage with a predetermined reference voltage for providing said delayed clock signal, wherein said comparator means changes said delay clock signal in direct relation to said first voltage being either greater or lesser than said predetermined reference voltage.

5. The clock chopper/expander circuit according to claim 1, further comprising level shifter means responsive to said delayed clock signal for providing a shifted delayed clock signal proportional to said delayed clock signal.

6. The clock chopper/expander circuit according to claim 5, wherein said shifted delayed clock signal has a voltage swing on the order of 0.3 volts higher than the voltage swing of the clock input signal.

7. The clock chopper/expander circuit according to claim 1, wherein said first cell means is additionally responsive to said clock output signal, wherein said first cell charges up said first voltage when either the clock input signal or said clock output signal are logic high, and discharges the voltage at said first node when both the clock input signal and said clock output signal are logic low.

8. The clock chopper/expander circuit according to claim 1, further comprising:

OR gate means responsive to the clock input signal and a test signal for performing an OR function thereto and for providing an OR signal indicative of the OR function result to said set input of said reset dominant latch means, wherein said reset dominant latch means is responsive to said OR signal and said delayed clock signal.

9. The clock chopper/expander circuit according to claim 1, further comprising:

multiplexer means responsive to an enable signal for multiplexing the clock input signal and said delayed clock signal, wherein said multiplexer means provides an inverted clock input signal to said reset input if said enable signal is logic high, and provides said delayed clock signal to said reset input if said enable signal is logic low.

10. A clock chopper/expander circuit for either chopping or expanding a clock input signal comprising:

delay circuit means responsive to the clock input signal for providing a delayed clock signal wherein a low to high transition of said delayed clock signal occurs TD seconds after each low to high transition of the clock input signal, said delay circuit having:

a) a first transistor connected between a first supply voltage and a first node, the control gate of said first transistor being responsive to the clock input signal;

b) first cell circuit means connected in parallel with said first transistor for charging up a second voltage at a second node when the clock input signal is high and discharging said first voltage when the clock input signal is low, said first cell circuit having a first cell for charging up said second node, and c) a second transistor connected in series with said first cell, having a control gate connected to a first reference voltage, a collector connected to said second node, and an emitter connected to said first node;

d) current source means connected to said first node for controlling a first current from said first node;

e) comparator means for comparing a first voltage at said first node with a predetermined reference voltage and for providing said delayed clock signal, wherein said comparator means changes said delayed clock signal in direct relation to said first voltage being either greater or lesser than said predetermined reference voltage; and reset dominant latch means having a set input responsive to the clock input signal and a reset input responsive to said delayed clock signal, for providing a clock output signal indicative of a set or reset status of said reset dominant latch means, wherein said reset dominant latch means is set if the clock input signal is logic high and said delayed clock signal signal is logic low and said reset dominant latch means is reset if said delayed clock signal is logic high.

11. The clock chopper/expander circuit according to claim 10, wherein said first cell comprises:

a third and a fourth npn transistor having their respective emitters, collectors, and bases connected to said second node;

a fifth pnp transistor having a collector connected to said first supply voltage, and an emitter and a base connected to said second node.

12. The clock chopper/expander circuit according to claim 10, wherein said current source means comprises:

a sixth npn transistor having a collector connected to said first node, an emitter connected to said second supply voltage, and a base connected to a bias current means for providing an adjustable bias current thereto, wherein said sixth npn transistor is connected in a current switch configuration with said first and second transistor means.

13. The clock chopper/expander circuit according to claim 10, wherein said current source means comprises:

a seventh npn transistor for controlling said first current, and having a collector connected to said first node, an emitter connected to said second supply voltage, and a base connected to a third node;

an eighth npn transistor for controlling a second current through said seventh transistor, and having an emitter connected to said second supply voltage, and a collector and a base connected to said third node;

a first resistor connected between said first supply voltage and said third node;

a first and a second Schottky diode connected oppositely and in parallel between said third node and a fourth node for filtering noise below the Schottky voltage of said Schottky diodes from said second node;

a second resistor connected between said fourth node and a fifth node for limiting a third current at said third node;

filter means for filtering electrostatic voltages and noise from said fourth node and having a third resistor connected between said first supply voltage and said fourth node, a third diode having a cathode connected to said first supply voltage and an anode connected to said fourth node, a fourth resistor connected between said second supply voltage and said fourth node, and a fourth diode having a cathode connected to said fourth node and an anode connected to said second supply voltage; and external, adjustable bias current supply means for providing bias current to said fourth node.

14. The clock chopper/expander circuit according to claim 10, further comprising:

ninth transistor connected between said first supply voltage and said first node, having a control gate responsive to said clock output signal, wherein the current from said first node is shared by said first, second, and ninth transistors.

15. The clock chopper/expander circuit according to claim 10, further comprising a voltage bias means responsive to said current source means for providing said second reference voltage in proportion to the amplitude of the current from said first node.

16. The clock chopper/expander circuit according to claim 10, further comprising a second cell circuit means responsive to said current source means for charging up said predetermined reference voltage at said second node in proportion to said first current.

17. The clock chopper/expander circuit according to claim 10, further comprising a second cell circuit means responsive to said current control means for providing said reference voltage in proportion to said first current, said second cell circuit means comprising:

a tenth and an eleventh npn transistor having their respective emitters, collectors, and bases connected to a fifth node;

a twelfth pnp transistor having a collector connected to said first supply voltage, and an emitter and a base connected to said fifth node.

a sixth resistor connected between said fifth node and a sixth node;

a seventh resistor connected between said sixth node and said first supply voltage;

a thirteenth npn transistor having a collector connected to said first supply, an emitter connected to a seventh node, and a base connected to said sixth node; and an eighth resistor connected between said seventh node and said second supply voltage, wherein said reference voltage is the voltage at said seventh node.

18. The clock chopper/expander circuit according to claim 10, further comprising:

level shifter means responsive to said delayed clock signal for shifting said delayed clock signal and providing a shifted delayed clock signal to said reset input of said reset dominant latch means.

19. The clock chopper/expander circuit according to claim 18, wherein said shifted delayed clock signal has a voltage swing shifted on the order of 0.3 volts higher than the voltage swing of the clock input signal.

20. A clock chopper/expander circuit for either chopping or expanding a clock input signal comprising:

delay circuit means responsive to the clock input signal for providing a repetitive delayed clock signal wherein a low to high transition said delayed clock signal occurs TD seconds after each low to high transition of the clock input signal, said delay circuit having:

a) a first transistor, a second transistor, a third transistor and a fourth transistor connected in a current switch configuration, said fourth transistor controlling a first shared current through said first, second and third transistors, wherein the control gate of said first transistor is connected to the clock input signal, the control gate of said second transistor is connected to a clock output signal, and the control gate of said third transistor is connected to a first reference voltage, and wherein said third transistor is turned on only when both said first and said second transistors are turned off;

b) a current bias source connected to the control gate of said fourth transistor for controlling a first current through said fourth transistor;

c) a first half memory cell connected in series with said third transistor, for charging up a first voltage at a first node when said third transistor is turned off, and discharging said first voltage when said third transistor is turned on;

d) comparator means for comparing said first voltage with a predetermined reference voltage for providing said delayed clock signal, wherein said comparator means changes said delayed clock signal in direct relation to the voltage at said first node being either greater or lesser than said predetermined reference voltage;

level shifter means responsive to said delayed clock signal for providing a reset signal proportional to said delayed clock signal, said reset signal having a voltage swing shifted on the order of 0.3 volts higher than the voltage swing of the clock input signal; and reset dominant latch means having a set input responsive to the clock input signal and a reset input responsive to said reset signal, for providing a clock output signal indicative of a set or reset status of said reset dominant latch means, wherein said reset dominant latch means is set if the clock input signal is logic high and said reset signal is logic low and said reset dominant latch means is reset if said reset signal is logic high.

21. The clock chopper/expander circuit according to claim 20, wherein said comparator means comprises:
a fifth, a sixth, and a seventh transistor connected in a current switch configuration, said seventh transistor controlling a second shared current through said fifth and sixth transistors, said fifth transistor having a control gate responsive to said first voltage, said sixth transistor having a control gate connected to a second reference voltage, and said seventh transistor having a control gate connected to a third reference voltage;
a first pull up resistor connected to the collector of said fifth transistor.

22. The clock chopper/expander circuit according to claim 20, further comprising a second cell responsive to said current source means for charging up said predetermined reference voltage at said second node in proportion to a second current from said first node.

23. The clock chopper/expander circuit according to claim 20, further comprising:
OR gate means responsive to the clock input signal and a test signal for performing an OR function thereto and for providing an OR signal indicative of the OR function result to said set input of said reset dominant latch means, wherein said reset dominant latch means is responsive to said OR signal and said reset signal.

24. The clock chopper/expander circuit according to claim 20, further comprising:
multiplexer means responsive to an enable signal for multiplexing the clock input signal and said reset signal, wherein said multiplexer means provides an inverted clock input signal to said reset input if said enable signal is logic high, and provides said reset signal to said reset input if said enable signal is logic low.

* * * * *